(12) United States Patent
Kim et al.

(10) Patent No.: US 10,711,187 B2
(45) Date of Patent: Jul. 14, 2020

(54) FLUORIDE PHOSPHOR, METHOD OF MANUFACTURING THE SAME, AND LIGHT EMITTING DEVICE

(71) Applicant: SAMSUNG ELECTRONICS CO., LTD., Suwon-si (KR)

(72) Inventors: Do Hoon Kim, Yokohama (JP); Izawa Takamasa, Yokohama (JP); Chul Soo Yoon, Suwon-si (KR); Sung Woo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 872 days.

(21) Appl. No.: 15/272,953

(22) Filed: Sep. 22, 2016

(65) Prior Publication Data

US 2017/0198218 A1    Jul. 13, 2017

(30) Foreign Application Priority Data

Jan. 13, 2016 (KR) .......... 10-2016-0004250

(51) Int. Cl.
*C09K 11/61* (2006.01)
*H01L 33/50* (2010.01)

(52) U.S. Cl.
CPC .......... *C09K 11/617* (2013.01); *H01L 33/502* (2013.01); *H01L 33/504* (2013.01); *H01L 2224/48091* (2013.01); *H01L 2224/48247* (2013.01); *H01L 2224/48257* (2013.01); *H01L 2924/181* (2013.01); *H01L 2933/0041* (2013.01)

(58) Field of Classification Search
CPC .................................................. C09K 11/617
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |

(Continued)

FOREIGN PATENT DOCUMENTS

| | | |
|---|---|---|
| JP | 2004-527637 A | 9/2004 |
| JP | 2009-528429 A | 8/2009 |

(Continued)

OTHER PUBLICATIONS

International Search Report dated Mar. 14, 2017, issued by the International Searching Authority in counterpart International Patent Application No. PCT/JP2017/001095 (PCT/ISA/210).

(Continued)

*Primary Examiner* — Matthew E. Hoban
(74) *Attorney, Agent, or Firm* — Sughrue Mion, PLLC

(57) ABSTRACT

A method of manufacturing a fluoride phosphor represented by a chemical formula $A_3MF_7:Mn^{4+}$ includes forming a first mixture by mixing a first raw material containing $A_2MF_6$ and a second raw material containing AF or $AHF_2$, forming a second mixture by mixing the first mixture and a sintering aid, and firing the second mixture. In the chemical formula, A is at least one selected from Li, Na, K, Rb, Cs and mixtures thereof, and M is at least one selected from Si, Ti, Zr, Hf, Ge, Sn, and mixtures thereof.

19 Claims, 12 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,497,973 B2 | 3/2009 | Radkov et al. |
| 7,501,656 B2 | 3/2009 | Han et al. |
| 7,648,649 B2 | 1/2010 | Radkov et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,847,309 B2 | 12/2010 | Radkov et al. |
| 7,940,350 B2 | 3/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,057,706 B1 | 11/2011 | Setlur et al. |
| 8,129,711 B2 | 3/2012 | Kang et al. |
| 8,179,938 B2 | 5/2012 | Kim |
| 8,252,613 B1 | 8/2012 | Lyons et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,710,487 B2 | 4/2014 | Lyons et al. |
| 8,735,931 B2 | 5/2014 | Han et al. |
| 8,766,295 B2 | 7/2014 | Kim |
| 8,906,724 B2 | 12/2014 | Murphy et al. |
| 2004/0155569 A1 | 8/2004 | Oskam et al. |
| 2006/0169986 A1 | 8/2006 | Radkov et al. |
| 2015/0035430 A1 | 2/2015 | Yoshida et al. |
| 2015/0329770 A1* | 11/2015 | Kaneyoshi ............... B05D 1/18 252/301.36 |
| 2016/0024378 A1* | 1/2016 | Murphy ............... C09K 11/617 362/84 |

FOREIGN PATENT DOCUMENTS

| | | |
|---|---|---|
| JP | 2010248411 A | 11/2010 |
| JP | 2011-12091 A | 1/2011 |
| JP | 2012224536 A | 11/2012 |
| JP | 2014141684 A | 8/2014 |
| JP | 2015-44971 A | 3/2015 |
| WO | 02/097859 A1 | 12/2002 |
| WO | 2017/010076 A1 | 1/2017 |

OTHER PUBLICATIONS

A. G. Paulusz: "Efficient Mn(IV) Emission in Fluorine Coordination", J. Electrochem Soc: SOLID-STATE Science and Technology, Jul. 1973, vol. 120, No. 7, p. 942-947 (6 pages total).

\* cited by examiner

FLUORIDE PHOSPHOR, METHOD OF MANUFACTURING THE SAME, AND LIGHT EMITTING DEVICE

CROSS-REFERENCE TO RELATED APPLICATION

This application claims priority from Korean Patent Application No. 10-2016-0004250, filed on Jan. 13, 2016 in the Korean Intellectual Property Office, the disclosure of which is incorporated herein by reference in its entirety.

BACKGROUND

1. Field

The present disclosure relates to a fluoride phosphor, a method of manufacturing the same, and a light emitting device.

2. Description of Related Art

Semiconductor light emitting elements emit light using the principle of recombining electrons and holes when an electrical current is applied thereto. Semiconductor light emitting elements have been widely used as light sources due to their various benefits, such as relatively low power consumption, high luminance, miniaturization, and the like. The range of applications for semiconductor light emitting devices was further expanded upon the development of nitride-based light emitting devices, and semiconductor light emitting elements have been employed in backlight units, domestic lighting devices, automotive lighting devices, and the like.

Light emitting devices using a semiconductor light emitting element may be provided with a light emitting element that produces excitation light and phosphors that are excited by the light emitted by the light emitting element so as to emit wavelength-converted light. This permits light emitting devices to have certain color characteristics that may be required. Thus, there has been demand for research on phosphors that can provide excellent characteristics in terms of color reproducibility, reliability, and the like, as well as light emitting devices using such phosphors.

SUMMARY

One or more example embodiments provide a fluoride phosphor having improved luminance and reliability, and a method of manufacturing the fluoride phosphor.

One or more example embodiments also provide a light emitting device using the fluoride phosphor, which has improved reliability.

According to an aspect of an example embodiment, a method of manufacturing a fluoride phosphor represented by a chemical formula $A_3MF_7:Mn^{4+}$ may include: forming a first mixture by mixing a first raw material containing $A_2MF_6$ and a second raw material containing $AF$ or $AHF_2$; forming a second mixture by mixing the first mixture with a sintering aid; and sintering the second mixture, wherein in the chemical formula, A is at least one selected from lithium (Li), sodium (Na), potassium (K), rubidium (Rb), cesium (Cs), and mixtures thereof, while M is at least one selected from silicon (Si), titanium (Ti), zirconium (Zr), hafnium (Hf), germanium (Ge), tin (Sn), and mixtures thereof.

According to an aspect of another example embodiment, a method of manufacturing a fluoride phosphor represented by a chemical formula $A_3MF_2:Mn^{4+}$ may include: forming a first mixture by mixing a first raw material containing $A_2MF_6$ and a second raw material containing $AF$ or $AHF_2$; forming a second mixture by mixing the mixture with a sintering aid; manufacturing a phosphor particle by firing the second mixture; and coating the phosphor particle with an ionic liquid, wherein in the chemical formula, A is selected from the group consisting of lithium (Li), sodium (Na), potassium (K), rubidium (Rb), cesium (Cs), and mixtures thereof, and M is selected from the group consisting of silicon (Si), titanium (Ti), zirconium (Zr), hafnium (Hf), germanium (Ge), tin (Sn), and mixtures thereof.

According to an aspect of another example embodiment, a fluoride phosphor may include phosphor particles represented by a chemical formula $A_3MF_2:Mn^{4+}$, and a coating layer covering a surface of the phosphor particles and including an ionic liquid, wherein in the chemical formula, A is selected from the group consisting of Li, Na, K, Rb, Cs, and mixtures thereof, and M is selected from the group consisting of Si, Ti, Zr, Hf, Ge, Sn, and mixtures thereof.

According to an aspect of another example embodiment, a light emitting device may include a light emitting element and a wavelength conversion portion absorbing excitation light emitted by the light emitting element and emitting visible light. The wavelength conversion portion may include phosphor particles represented by chemical formula $A_3MF_7:Mn^{4+}$ and a coating layer covering a surface of the phosphor particles and including an ionic liquid, wherein in the chemical formula, A is selected from the group consisting of Li, Na, K, Rb, Cs, and mixtures thereof, and M is selected from the group consisting of Si, Ti, Zr, Hf, Ge, Sn, and mixtures thereof.

BRIEF DESCRIPTION OF DRAWINGS

The above and/or other aspects will be more clearly understood from the following detailed description of example embodiments taken in conjunction with the accompanying drawings, in which.

DETAILED DESCRIPTION

Hereinafter, example embodiments will be described as follows with reference to the attached drawings. It should be understood that aspects described with respect to specific embodiments may be applicable to other disclosed embodiments.

Fluoride Phosphor and Method of Manufacturing the Same

A fluoride phosphor according to an example embodiment may include a fluoride represented by chemical formula $A_3MF_7:Mn^{4+}$ (Chemical Formula 1), and the chemical formula may satisfy the following conditions.

1) A is at least one selected from lithium (Li), sodium (Na), potassium (K), rubidium (Rb), cesium (Cs), and mixtures thereof.

2) M is at least one selected from silicon (Si), titanium (Ti), zirconium (Zr), hafnium (Hf), germanium (Ge), tin (Sn), and mixtures thereof.

Non-limiting examples of specific fluoride phosphor particles that may be represented by the Chemical Formula 1 include $K_3SiF_7:Mn^{4+}$, $K_3TiF_7:Mn^{4+}$, $K_3ZrF_7:Mn^{4+}$, $K_3SnF_7:Mn^{4+}$, $Na_3TiF_7:Mn^{4+}$, and $Na_3ZrF_7:Mn^{4+}$. The fluoride phosphor may have a composition that includes two positive ions (i.e., a mixture), such as $(Rb, K)_3SiF_7:Mn^{4+}$ and $(Cs, K)_3SiF_7:Mn^{4+}$. The fluoride phosphor may, for example, contain manganese (Mn) in an amount of from 1 mol % to 20 mol %. The fluoride phosphor may, for example, have a particle size d50 within a range of from 5 μm to 35 μm. However, the particle size may be variously changed in example embodiments.

The fluoride phosphor may be excited by light having a wavelength ranging from the ultraviolet region to the blue region, thereby emitting red light. For example, the fluoride phosphor may provide for a phosphor that absorbs excitation light having a peak wavelength in the range of 300 nm to 500 nm that emits light having a peak wavelength in the range of 620 nm to 640 nm.

Figure 1:
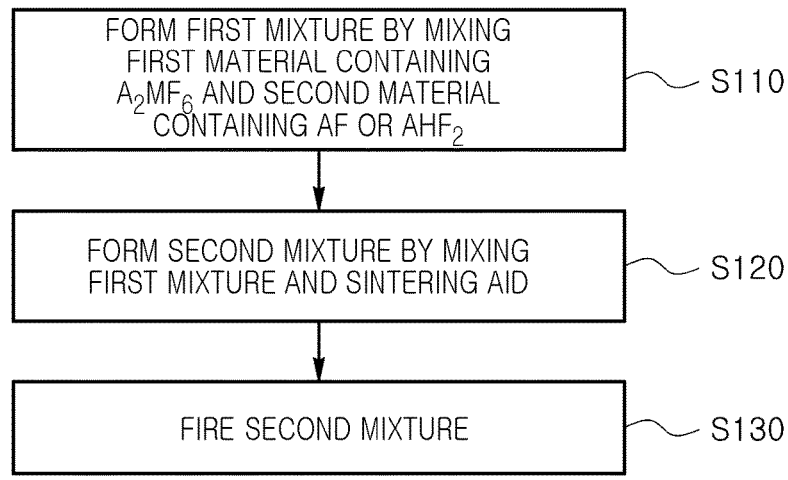
FIG. 1 is a flowchart illustrating a method of manufacturing a fluoride phosphor according to an example embodiment.

FIG. 1 is a flowchart illustrating a method of manufacturing a fluoride phosphor according to an example embodiment.

With reference to FIG. 1, a method of manufacturing the fluoride phosphor according to an exemplary embodiment may include: forming a first mixture by mixing a first raw material containing $A_2MF_6$ and a second raw material containing AF or $AHF_2$ (S110), where A and M are as defined in Chemical Formula 1; forming a second mixture by mixing the first mixture and a sintering aid (S120); and firing the second mixture (S130). The fluoride phosphor according to an exemplary embodiment may be manufactured by a solid state reaction method according to the operations.

Referring again to FIG. 1, the first mixture may be formed by mixing the first raw material containing $A_2MF_6$ and the second raw material containing AF or $AHF_2$ in S110.

The first and second raw materials may be in powder form, and may be mixed in a molar ratio of from 1:0.8 to 1:1.5.

According to an example embodiment, the first raw material may be an $A_2MF_6:Mn^{4+}$ phosphor or a mixture of $A_2MF_6$ and $A_2MnF_6$, while the second raw material may be AF or $AHF_2$. For example, the first raw material may be a $K_2SiF_6:Mn^{4+}$ phosphor or a mixture of $K_2SiF_6$ and $K_2MnF_6$, and the second raw material may be KF.

Next, the second mixture may be formed by mixing the first mixture and the sintering aid in S120.

The sintering aid may play the role of accelerating the reaction between the first and second raw materials during firing in a subsequent operation. The sintering aid may generate fluorine gas during firing, and the reaction may be accelerated by the fluorine gas. Therefore, the sintering aid may be a material containing fluorine. For example, the sintering aid may be at least one of $NH_4F$, $NH_4HF_2$, $F_2$, $XeF_2$, or $KHF_2$.

The sintering aid may be added to the first mixture in an amount of more than 5 wt %. When the sintering aid is not added, the firing temperature may need to be increased, which may lead to the decomposition of the light emitting component in a subsequent operation, thereby causing no light to be emitted by the so-manufactured phosphor. However, in an example embodiment, the firing temperature may be reduced, and light emitting characteristics may be secured in such a manner when the sintering aid is used. Further details in this respect are described with reference to FIGS. 2A and 2B below.

Again referring to FIG. 1, the firing of the second mixture may be performed in S130.

The firing temperature may be within the temperature range of 200° C. to 500° C., and for example, within the range of 300° C. to 400° C. In addition, the firing may be performed in an atmosphere of argon (Ar), nitrogen ($N_2$), fluorine ($F_2$), nitrogen/fluorine ($N_2/F_2$) or nitrogen/hydrogen ($N_2/H_2$). The firing time thereof may be within the range of 4 hours to 8 hours after the required firing temperature is reached.

A fluoride phosphor having the composition $A_3MF_7:Mn^{4+}$ may be manufactured by the operations described herein. According to the example embodiment, the fluoride phosphor may be manufactured through a process simplified by a solid state reaction method.

Hereinafter, example embodiments of a fluoride phosphor having chemical formula $K_3SiF_7:Mn^{4+}$ will be described.

Figure 2A:
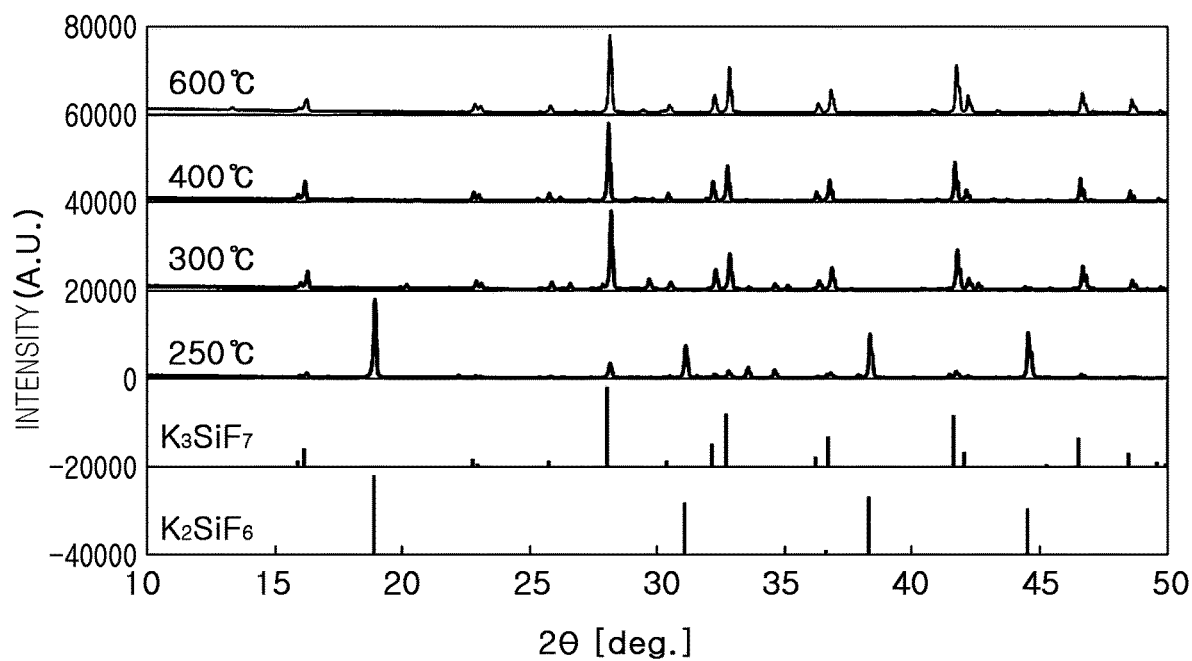
FIGS. 2A and 2B are graphs illustrating X-ray diffraction (XRD) results of a fluoride phosphor according to an example embodiment and a comparative example.
Figure 2B:
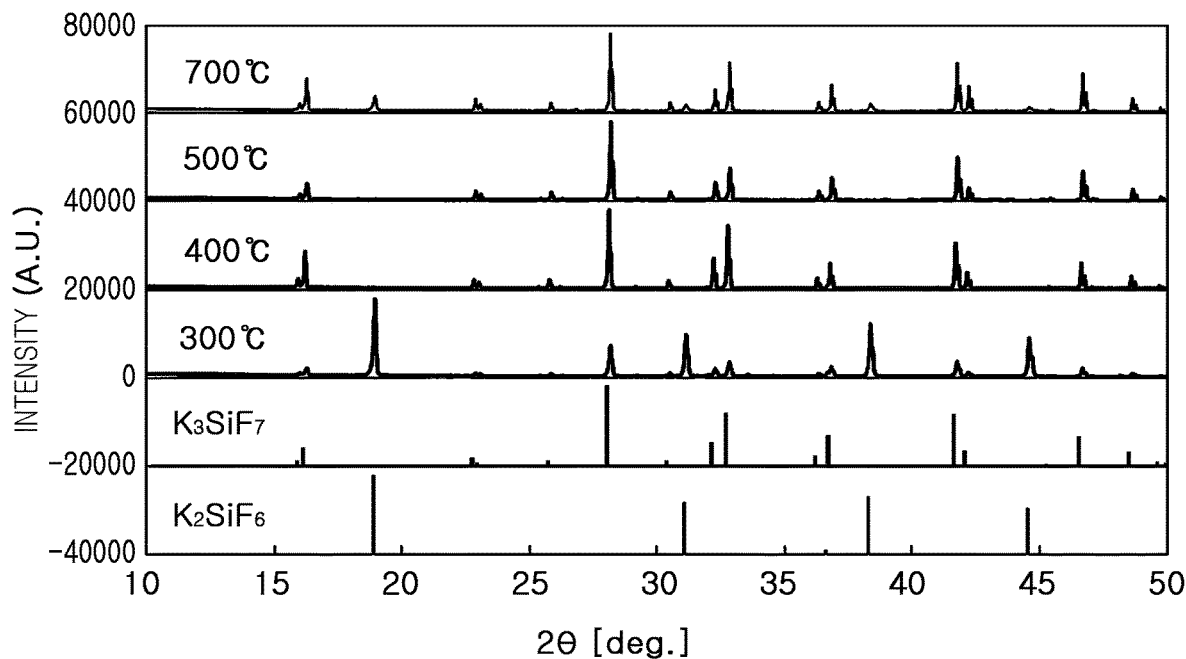

FIGS. 2A and 2B are graphs illustrating X-ray diffraction (XRD) results of a fluoride phosphor according to an example embodiment and a comparative example of the present disclosure.

In FIG. 2A, XRD results of $K_3SiF_7:Mn^{4+}$ phosphors, based on the firing temperatures used, are represented. The phosphors according to this example embodiment were manufactured using a $K_2SiF_6:Mn^{4+}$ phosphor as the first raw material, using KF as the second raw material, and using $NH_4F$ as the sintering aid. In FIG. 2B, the XRD results of $K_3SiF_7:Mn^{4+}$ phosphors manufactured using no sintering aid, thereby providing for a comparative example, are shown. Analysis of the XRD results may be performed by comparing the results from $K_2SiF_6$ and $K_3SiF_7$. Since $K_2SiF_6$ has a cubic system structure, and $K_3SiF_7$ has a tetragonal system structure, $K_2SiF_6$ and $K_3SiF_7$ may exhibit different XRD peaks.

With reference to FIG. 2A, when the firing temperature is 250° C., $K_3SiF_7$ was barely synthesized, and when the firing temperature was 300° C. or higher, a single-phase $K_3SiF_7$ was synthesized.

With reference to FIG. 2B, in the case of firing without $NH_4F$, a sintering aid, mixed at a firing temperature of below 400° C., a $K_3SiF_7$ structure was only barely formed, while the single-phase $K_3SiF_7$ was manufactured at a firing temperature of 400° C. or higher. However, at the firing temperature of 400° C. or higher, light emission was not observed. From this data, the inventors understand that $K_2MnF_6$, a light emitting component in the phosphor, is pyrolyzed by relatively high temperatures.

However, FIGS. 2A and 2B show that, the single-phase $K_3SiF_7$ may be synthesized at a firing temperature of 300° C. according to an example embodiment, which is lower than the 400° C. temperature that may pyrolyze $K_2MnF_6$, by using a sintering aid. Thus, the firing temperature may be in the range of a temperature higher than 250° C. and lower than 400° C.

Figure 3:
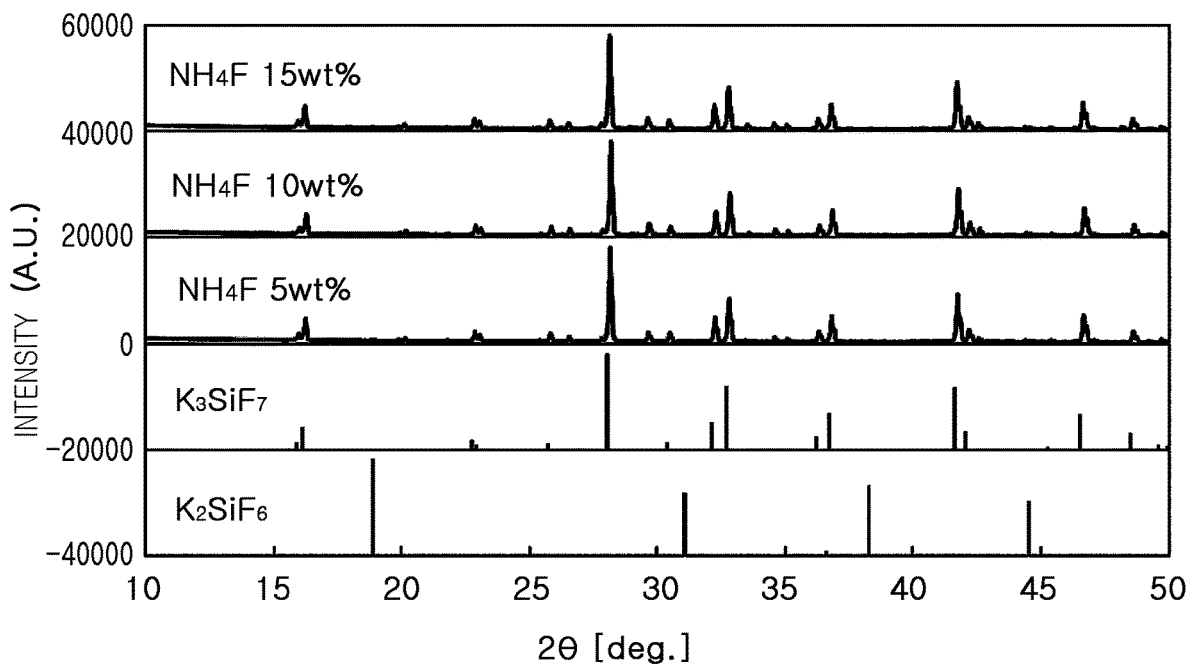
FIG. 3 is a graph illustrating XRD results of a fluoride phosphor according to an example embodiment.

FIG. 3 is a graph illustrating XRD results of a fluoride phosphor according to an example embodiment.

In FIG. 3, XRD results of different $K_3SiF_7:Mn^{4+}$ phosphors manufactured by changing the amount of $NH_4F$, a sintering aid, are represented for the situation in which the first raw material is a $K_2SiF_6:Mn^{4+}$ phosphor, and the second raw material is KF. When the phosphors shown in FIG. 3 were manufactured, the firing process was performed at 300° C. in a nitrogen/fluorine ($N_2/F_2$) atmosphere for six hours. Analysis of the XRD results may be performed by comparing the results from $K_2SiF_6$ and $K_3SiF_7$.

With reference to FIG. 3, when the amount of $NH_4F$ was 5 wt % or greater, XRD crystal peaks corresponding to those of $K_3SiF_7$ were obtained. When the amount of $NH_4F$ was 0 wt %, XRD crystal peaks corresponding to those of $K_2SiF_6$ were obtained at a firing temperature of 300° C., as described with reference to FIG. 2B. Thus, it can be confirmed that when the amount of $NH_4F$ is 5 wt % or greater, a single-phase $K_3SiF_7$ may be synthesized.

Figure 4:
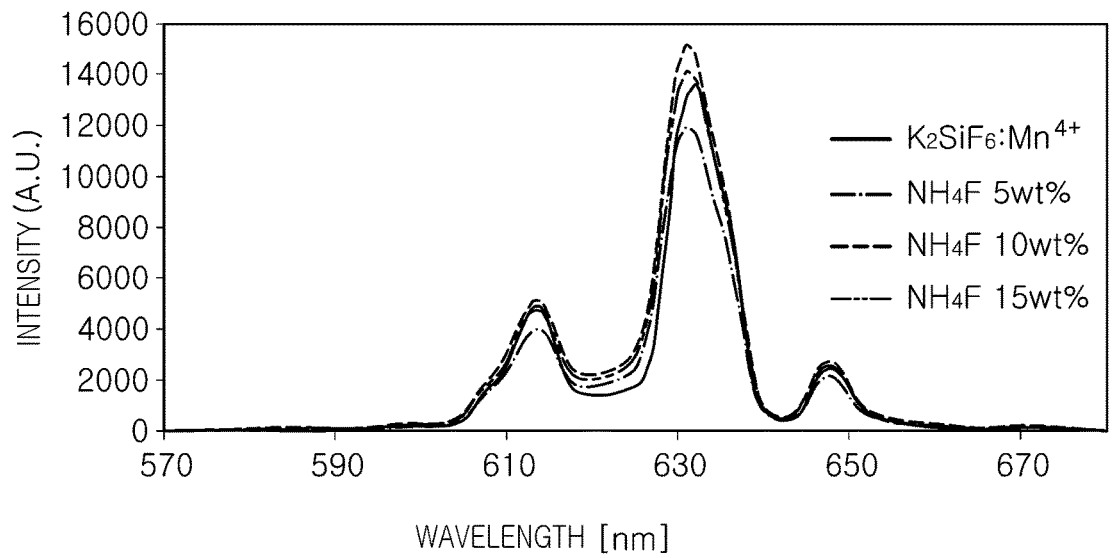
FIG. 4 is a graph illustrating a light emitting spectrum of a fluoride phosphor according to an example embodiment.

FIG. 4 is a graph illustrating a light emitting spectra of a fluoride phosphor according to an example embodiment. In FIG. 4, spectral characteristics of the phosphors manufactured in the same manner as example embodiments illustrated in FIG. 3 are shown.

With reference to FIG. 4, it can be confirmed that a slight difference in luminance occurs depending on the amount of $NH_4F$ used. When the amount of $NH_4F$ was 10 wt %, the highest luminance was represented. Further, when the amount of $NH_4F$ was 10 wt % or 15 wt %, the resulting luminance was higher than that of a $K_2SiF_6:Mn^{4+}$ phosphor.

Light emitting area ratios and peak wavelengths of the data shown in FIG. 4 are represented in Table 1.

TABLE 1

| | $K_2SiF_6:Mn^{4+}$ | $NH_4F$ 5 wt % | $NH_4F$ 10 wt % | $NH_4F$ 15 wt % |
|---|---|---|---|---|
| Light Emitting Area Ratio | 100% | 94% | 119% | 111% |
| Peak Wavelength | 632 nm | 631 nm | 631 nm | 631 nm |

In terms of the light emitting area ratio, $NH_4F$, a sintering aid, in an amount of 10 wt % and 15 wt % provided for light emitting area ratios greater than that of the $K_2SiF_6:Mn^{4+}$ phosphor. In addition, with respect to the peak wavelength, Table 1 shows that example embodiments of the present disclosure represented a peak wavelength less than that of the $K_2SiF_6:Mn^{4+}$ phosphor by 1 nm.

As such, when $K_3SiF_7:Mn^{4+}$ phosphors are manufactured according to an example embodiment, the luminance of the manufactured phosphors may be secured by adjusting the amount of a sintering aid, such as $NH_4F$. Furthermore, a phosphor having luminance higher than that of $K_2SiF_6:Mn^{4+}$ phosphor may be manufactured by adding $NH_4F$ of 10 wt % or greater.

Figure 5:
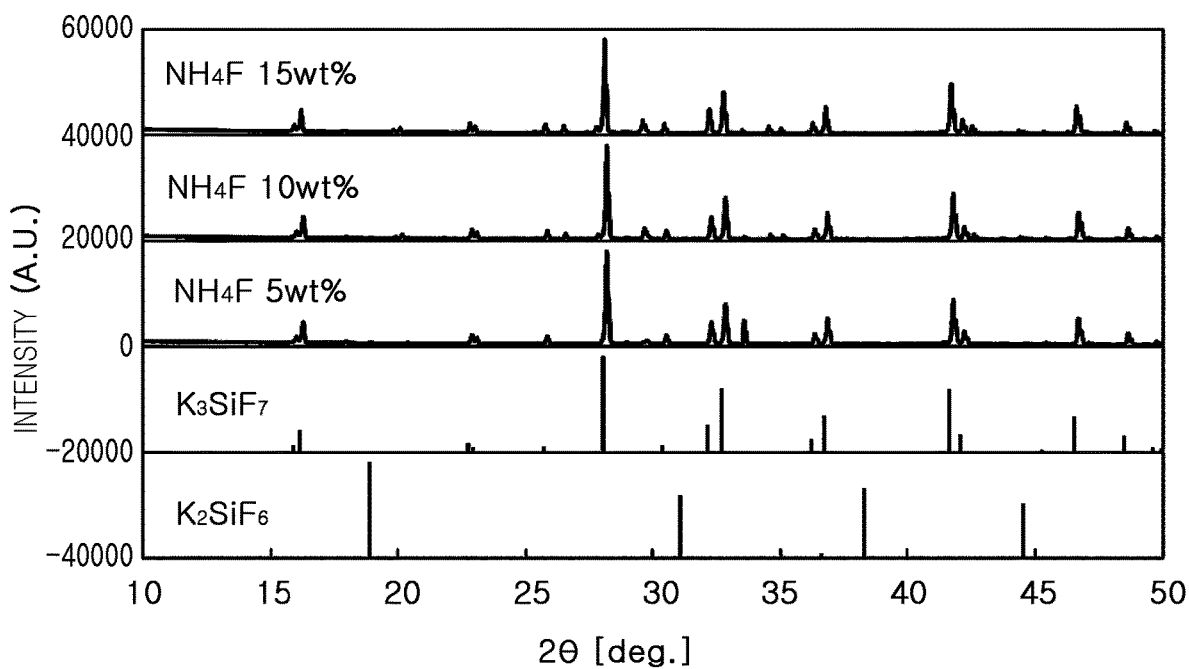
FIG. 5 is a graph illustrating XRD results of a fluoride phosphor according to an example embodiment.

FIG. 5 is a graph illustrating XRD results of a fluoride phosphor according to an example embodiment. In FIG. 5 shows XRD results of different $K_3SiF_7:Mn^{4+}$ phosphors manufactured by changing the amount of $NH_4F$, a sintering aid, when the first raw material is a mixture of $A_2MF_6$ and $A_2MnF_6$, where A and M are defined as above with respect to Chemical Formula 1, and the second raw material is KF. When the phosphors were manufactured, a firing process was performed at 300° C. in an atmosphere of nitrogen/fluorine ($N_2/F_2$) for six hours. Analysis of the XRD results may be performed by comparing the results from $K_2SiF_6$ and $K_3SiF_7$.

With reference to FIG. 5, when the amount of $NH_4F$ was 5 wt % or greater, XRD crystal peaks corresponding to those of $K_3SiF_7$ were obtained. Thus, it was confirmed that even when the first raw material was the mixture of $A_2MF_6$ and $A_2MnF_6$, if the amount of $NH_4F$ is 5 wt % or greater, a single-phase $K_3SiF_7$ may be synthesized.

Figure 6:
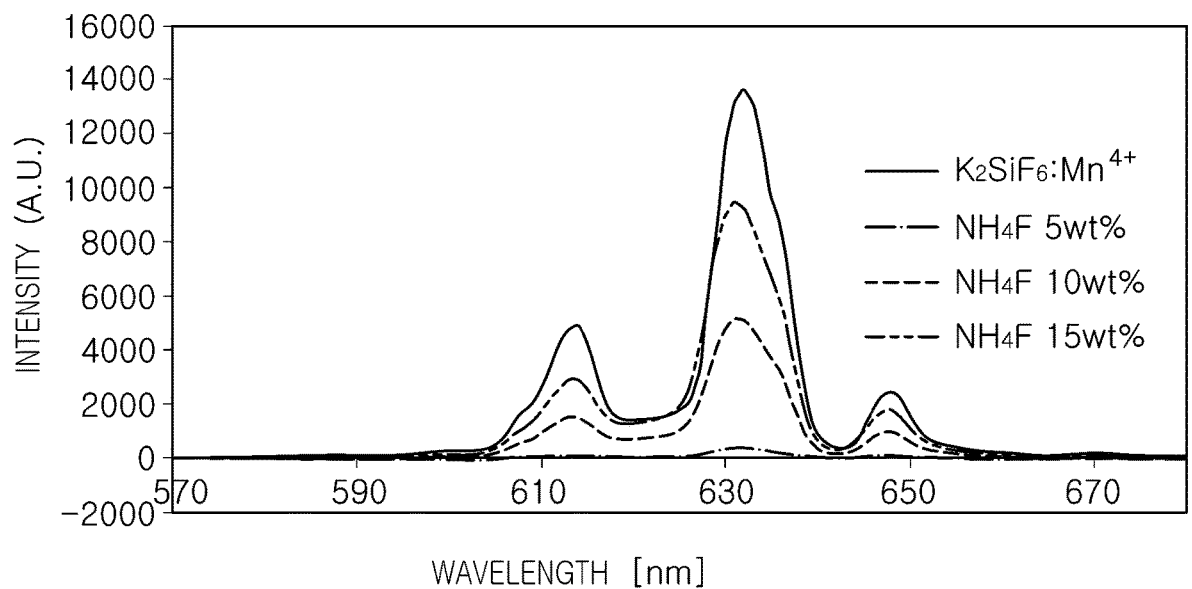
FIG. 6 is a graph illustrating a light emitting spectrum of a fluoride phosphor according to an example embodiment.

FIG. 6 is a graph illustrating light emitting spectra of fluoride phosphors according to an example embodiment. In FIG. 6, spectra of fluoride phosphors having different amounts of $NH_4F$ of phosphors manufactured in the same manner as the example embodiments illustrated in FIG. 5 are shown.

With reference to FIG. 6, it can be confirmed that a slight difference in luminance occurs depending on the amount of $NH_4F$ used. When the amount of $NH_4F$ was 15 wt %, the highest luminance was represented. In addition, when the amount of $NH_4F$ was 5 wt % and 10 wt %, the resulting luminance was lower than that when the amount of $NH_4F$ was 15 wt %. In addition, these example embodiments exhibited lower luminance than a $K_2SiF_6:Mn^{4+}$ phosphor.

Light emitting area ratios and peak wavelengths are represented as in Table 2.

TABLE 2

| | $K_2SiF_6:Mn^{4+}$ | $NH_4F$ 5 wt % | $NH_4F$ 10 wt % | $NH_4F$ 15 wt % |
|---|---|---|---|---|
| Light Emitting Area Ratio | 100% | 2% | 41% | 74% |
| Peak Wavelength | 632 nm | 631 nm | 631 nm | 631 nm |

Example embodiments provided light emitting area ratios less than that of the $K_2SiF_6:Mn^{4+}$ phosphor, and provided luminance lower than that of the phosphor of the example embodiment described with reference to FIG. 4. In addition, these example embodiments provided a peak wavelength less than that of the $K_2SiF_6:Mn^{4+}$ phosphor by 1 nm.

It was confirmed that when $K_3SiF_7:Mn^{4+}$ phosphors are manufactured according to this and other embodiments, luminance of the manufactured phosphors could be controlled by adjusting the amount of $NH_4F$, a sintering aid.

Figure 7:
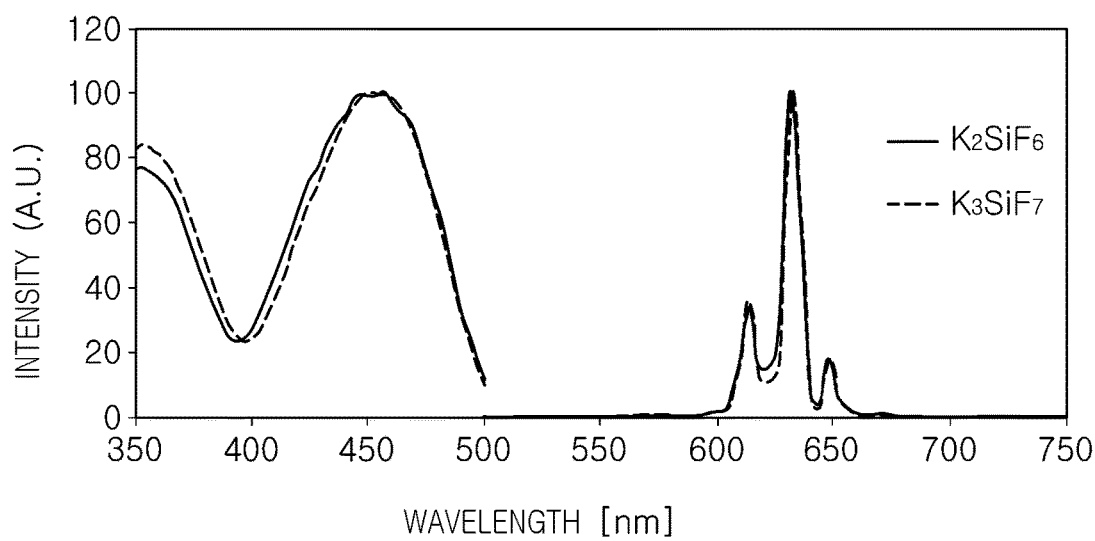
FIG. 7 is a graph illustrating an excitation spectrum and a light emitting spectrum of a fluoride phosphor according to an example embodiment.

FIG. 7 is a graph illustrating an excitation spectrum and a light emitting spectrum of a fluoride phosphor according to an example embodiment.

With reference to FIG. 7, spectral characteristics of $K_3SiF_7:Mn^{4+}$, a fluoride phosphor, are shown together with a $K_2SiF_6:Mn^{4+}$ phosphor, a comparative example, according to this embodiment. The emission wavelength of the $K_3SiF_7:Mn^{4+}$ phosphor was within the range of 620 nm to 640 nm, corresponding to a red wavelength band, and in detail, represented an emission peak at around 631 nm. It was confirmed that the emission peak is in a wavelength region shorter than the 632 nm wavelength of the $K_2SiF_6:Mn^{4+}$ phosphor by about 1 nm, and thus, the visibility of the light emitting region of the $K_3SiF_7:Mn^{4+}$ phosphor was increased as compared to the $K_2SiF_6:Mn^{4+}$ phosphor. Thus, when the light emitting area of the $K_3SiF_7:Mn^{4+}$ phosphor is the same as or greater than that of the $K_2SiF_6:Mn^{4+}$ phosphor, the optical properties of a light emitting device including the $K_3SiF_7:Mn^{4+}$ phosphor may be improved.

The $K_3SiF_7:Mn^{4+}$ phosphor exhibits relatively high excitation efficiency in the range of from about 340 nm to about 380 nm and the range of about 420 nm to about 470 nm. Since a $K_3SiF_7:Mn^{4+}$ phosphor has a relatively wide excitation region as compared to a $K_2SiF_6:Mn^{4+}$ phosphor, when the $K_3SiF_7:Mn^{4+}$ phosphor is applied to a light emitting diode (LED) having a relatively wide wavelength range, the excitation efficiency thereof may be relatively high.

Hereinafter, example embodiments of a fluoride phosphor including two positive ions will be described.

Figure 8:
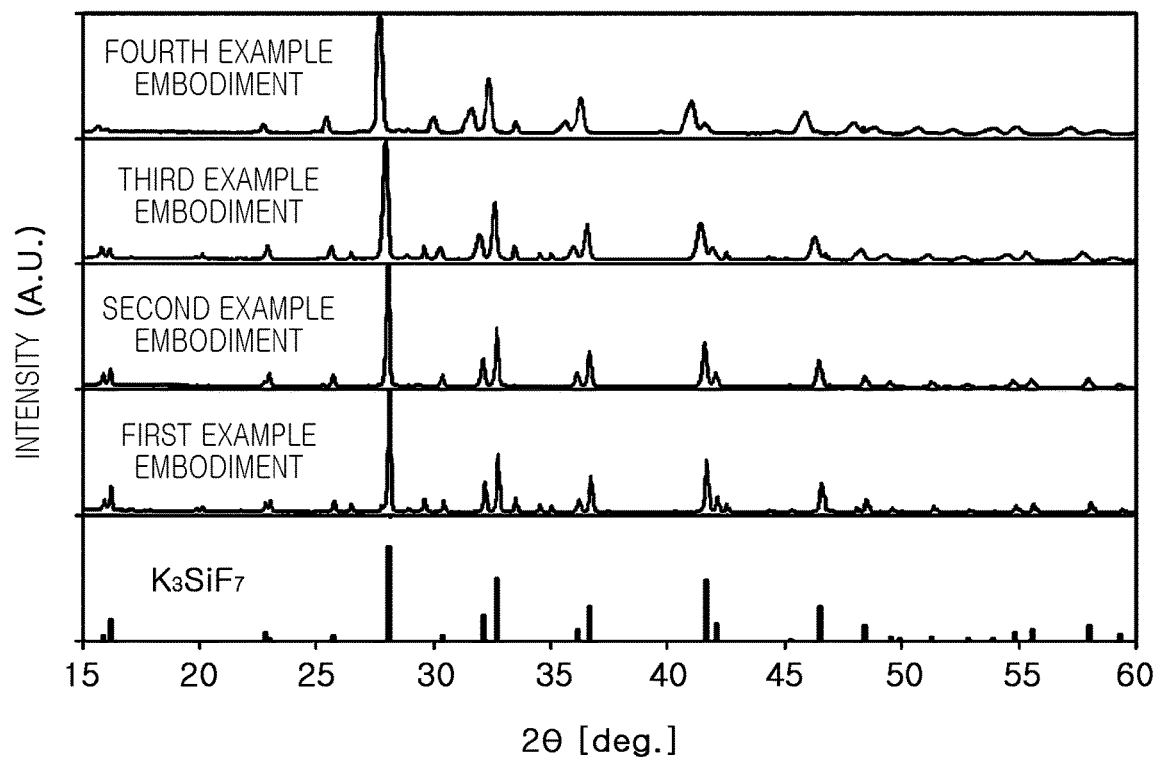
FIG. 8 is a graph illustrating XRD results of a fluoride phosphor according to an example embodiment.

FIG. 8 is a graph showing XRD results of a fluoride phosphor according to an example embodiment.

A fluoride phosphor in this example embodiment may have a composition of $(Rb, K)_3SiF_7:Mn^{4+}$. A $(Rb, K)_3SiF_7:Mn^{4+}$ phosphor was manufactured using the manufacturing method described above, with $K_2SiF_6:Mn^{4+}$ including 3% manganese being used as the first raw material, and RbF and KF being used as the second raw material. Phosphors in first to fourth example embodiments were manufactured by variously changing the molar ratio of respective materials.

In particular, the molar ratio of $K_2SiF_6:Mn^4:RbF:KF$ was 4:0.6:5.6 in the first example embodiment; 4:1.5:4.5 in the second example embodiment; 4:3:3 in the third example embodiment; and 4:6:0 in the fourth example embodiment. 10 wt % of $NH_4F$ was used as the sintering aid. When the phosphors were manufactured, a firing process was performed at 300° C. in an atmosphere of nitrogen/hydrogen $(N_2/H_2)$ including 4% $H_2$ for six hours.

With reference to FIG. 8, XRD results of the above four example embodiments are shown, and analysis may be provided by comparing the results with $K_3SiF_7$. In the case of the fourth example embodiment, in which no KF was added as part of the second raw materials, the $K_3SiF_7$ structure was maintained. In addition, although one of three potassium (K) ions was substituted with a rubidium (Rb) ion, the $K_3SiF_7$ structure was synthesized. The second example embodiment provides for XRD peaks similar to those of $K_3SiF_7$. Since the Rb ion has an ion radius greater than that of the K ion, as the substitution amount thereof is increased, the XRD peaks thereof showed a tendency to move toward a lower angle.

Figure 9:
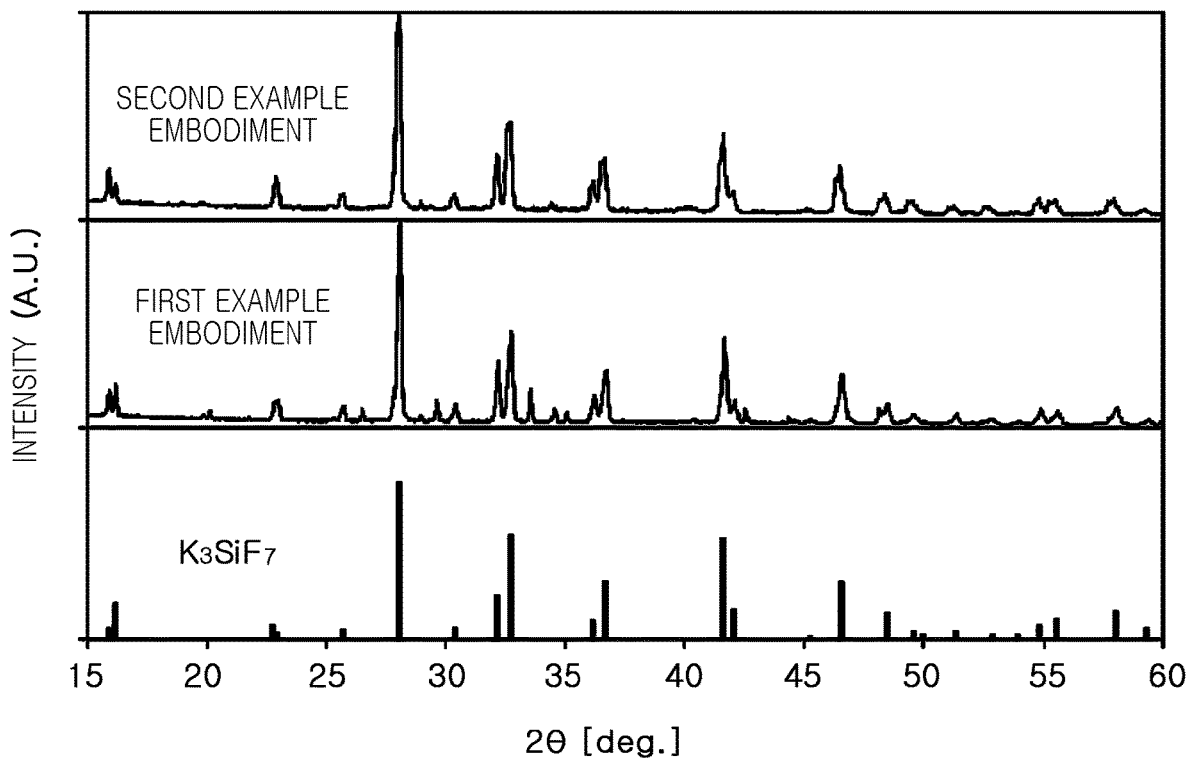
FIG. 9 is a graph illustrating XRD results of a fluoride phosphor according to an example embodiment.

FIG. 9 is a graph showing XRD results of a fluoride phosphor according to an example embodiment.

The fluoride phosphor in this exemplary embodiment may have the composition $(Cs, K)_3SiF_7:Mn^{4+}$. A $(Cs, K)_3SiF_7:Mn^{4+}$ phosphor was manufactured using the manufacturing method described above, where $K_2SiF_6:Mn^{4+}$ including 3% manganese was used as the first raw material, and CsF and KF were used as the second raw material. Phosphors of a first and second example of this embodiment were manufactured by variously changing a molar ratio of respective materials.

The molar ratio of $K_2SiF_6:Mn^4:CsF:KF$ was 4:0.6:5.6 in the first example of this embodiment, and 4:1.5:4.5 in the second example of this embodiment. 10 wt % of $NH_4F$ was used as the sintering aid. When the phosphors were manufactured, a firing process was performed at 300° C. in an atmosphere of nitrogen/hydrogen $(N_2/H_2)$ including 4% $H_2$ for six hours.

With reference to FIG. 9, XRD results of these two example of this embodiments (entitled "First Example Embodiment" and "Second Example Embodiment," respectively) are shown with reference to $K_3SiF_7$. When a cesium (Cs) ion was substituted with a small amount of a potassium (K) ion, the $K_3SiF_7$ structure was maintained. However, as the substitution amount thereof was increased, an impurity of $Cs_2SiF_6$ was generated.

Figure 10:
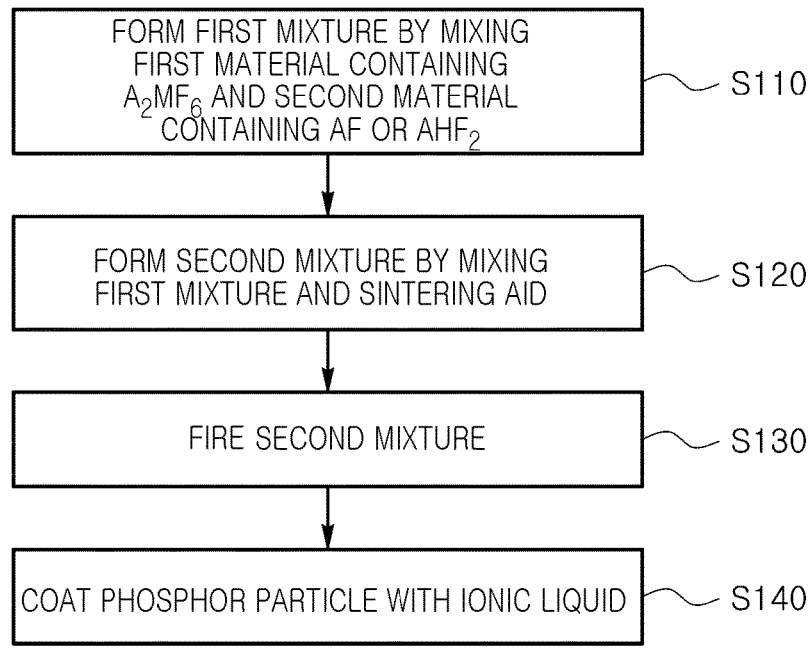
FIG. 10 is a flowchart illustrating a method of manufacturing a fluoride phosphor according to an example embodiment.

FIG. 10 is a flowchart illustrating a method of manufacturing a fluoride phosphor according to an example embodiment.

With reference to FIG. 10, operations from S110 to S130, described with reference to FIG. 1, may be performed in the same way, such that a phosphor particle may be manufactured.

Subsequently, the phosphor particle may be coated with an ionic liquid in S140.

The ionic liquid may be a material in which a positive ion and a negative ion may not crystallize, but may instead remain in a liquid state, due to asymmetry in the sizes thereof. In terms of surface treatment, the phosphor particle may be coated with the ionic liquid, and thus, the entirety of a phosphor particle surface may be coated. As a non-limiting example, the ionic liquid may be a material including fluorine. As additional non-limiting examples, the ionic liquid may be a pyrrolidinium-based ionic liquid. For example, the ionic liquid may include 1-methyl-1-propylpyrrolidinium bis (trifluoromethanesulfonyl) imide having the molecular formula $C_{10}H_{18}F_6N_2O_4S_2$.

In S140, the coating of the phosphor particles may be performed by adding the phosphor particles to the ionic liquid to be stirred, and the resulting composition may be mixed. Thus, the manufactured fluoride phosphor may include the ionic liquid material or an element originated from the ionic liquid on a surface thereof. As such, the ionic liquid may be coated onto the phosphor particle as a part of the process of synthesizing a fluoride phosphor. This provides for an improvement in process efficiency, since surface treatment or coating may be performed using no additional separate device, but rather using the simple process disclosed herein.

Figure 11:
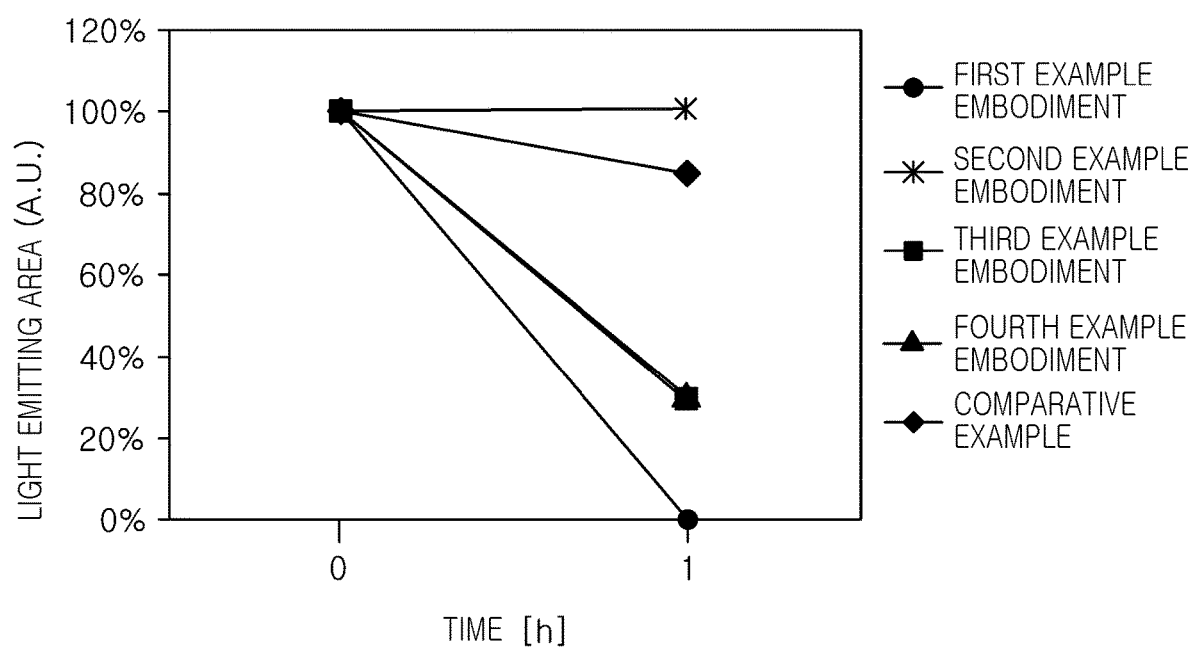
FIG. 11 is a graph illustrating reliability of a fluoride phosphor according to an example embodiment.

FIG. 11 is a graph showing the reliability of a fluoride phosphor according to an example embodiment.

With reference to FIG. 11, the results from testing a light emitting area maintenance rate of a manufactured fluoride phosphor, performed under conditions of high temperatures and high humidity, are shown. In particular, the fluoride phosphor was preserved in a powder state at 85° C. and 85% humidity for one hour.

The first example embodiment referred to in FIG. 11 is a $K_3SiF_7:Mn^{4+}$ phosphor manufactured according to the example embodiment described with reference to FIG. 1. The $K_3SiF_7:Mn^{4+}$ phosphor was manufactured by mixing 2.2 g of $K_2SiF_6:Mn^{4+}$ and 0.58 g of KF, mixing 10 wt % of NH$_4$F, and firing. Firing was performed at 300° C. in an atmosphere of nitrogen/hydrogen (N$_2$/H$_2$) including 4% H$_2$ for six hours.

The second example embodiment referred to in FIG. 11 was made by adding 1 cc of 1-methyl-1-propylpyrrolidinium bis (trifluoromethanesulfonyl) imide to 0.5 g of the K$_3$SiF$_7$:Mn$^{4+}$ phosphor of the first example embodiment and stirring.

The third and fourth example embodiments referred to in FIG. 11 were made by coating the K$_3$SiF$_7$:Mn$^{4+}$ phosphor of the first example embodiment with silicone oligomer (KR-213 produced by Shin-Etsu Chemical Co.). The third example embodiment was made by adding 1.5 g of KR-213 to 30 g of ethanol and stirring, and then 6 g of the K$_3$SiF$_7$:Mn$^{4+}$ phosphor was added and stirred, and then the composition was dried. In the fourth example embodiment, 1 g of the K$_3$SiF$_7$:Mn$^{4+}$ phosphor was added to 20 ml of ethanol, and 2 ml of 48% HF was added, followed by stirring, cleaning with ethanol, and drying. Subsequently, the fourth example embodiment was coated with KR-213, as in the third example embodiment.

The comparative example referred to in FIG. 11, a K$_2$SiF$_6$:Mn$^4$ phosphor, was made by slowly adding a second solution of 13.95 g KF dissolved in 4 ml HF at 48% to a first solution dissolving 1.19 g K$_2$MnF$_6$ manufactured separately from 4.8 g SiO$_2$ in 100 ml HF at 48% so as to collect a precipitate and washing the precipitate with HF at 20%.

The light emitting area shown in FIG. 11 was an integrated value of the light emitting spectrum in the wavelength range of 590 nm to 650 nm, emitted by using an excitation light of 450 nm, and the maintenance rate thereof was measured based on the initial light emitting area.

As shown in FIG. 11, phosphors in the third and fourth example embodiments, coated with silicone oligomer, maintained light emitting area maintenance rates of 29.6% and 30.2%, respectively, which is higher than that of the phosphor of the first example embodiment, which was not coated. However, phosphors of the first, third, and fourth example embodiments each exhibited light emitting area maintenance rates lower than the 84.8% of the comparative example.

The second example embodiment, which was coated with an ionic liquid, maintained the light emitting area of its initial state, thereby exhibiting the highest light emitting area maintenance rate, of 100.6%, and this embodiment exhibited a light emitting area maintenance rate higher than that of the comparative example. Therefore, it was confirmed that the fluoride phosphor according to the second example embodiment may be protected by being coated with an ionic liquid, so that its vulnerability to moisture may be improved, and its light emitting performance may be maintained.

Light Emitting Device Including Fluoride Phosphor

Figure 12:
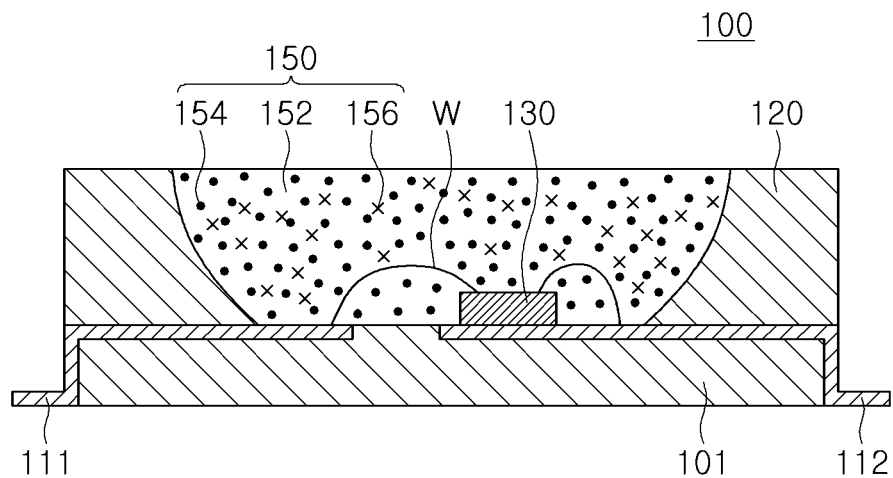
FIG. 12 is a schematic cross-sectional view of a light emitting device according to an example embodiment.

FIG. 12 is a schematic cross-sectional view of a light emitting device according to an example embodiment.

With reference to FIG. 12, a light emitting device 100 may include a substrate 101, a light emitting element 130 disposed on the substrate 101, and a wavelength conversion unit 150. In addition, the light emitting device 100 may include a pair of lead frames 111 and 112 electrically connected to the light emitting element 130, a body portion 120 having a cup shape, and a conductive wire W connecting the light emitting element 130 to the lead frames 111 and 112. Thus, the light emitting device 100 may be a light emitting device package.

The substrate 101 may be molded using an opaque resin or a resin having relatively high reflectivity, and may also be molded using a polymer resin that is able to be molded using an injection molding process. Alternatively, the substrate 101 may be formed from a ceramic, and in such a case, heat emissions may be facilitated. According to an example embodiment, the substrate 101 may be a printed circuit board having a wiring pattern formed thereon.

The pair of lead frames 111 and 112 may be disposed on the substrate 101, and may be electrically connected to the light emitting element 130 so as to apply driving power to the light emitting element 130. The lead frames 111 and 112 may be electrically connected to the light emitting element 130 by the conductive wire W, and may be used as terminals for receiving an external electrical signal. To this end, the lead frames 111 and 112 may be formed from a metal having excellent conductivity. According to an example embodiment, the light emitting element 130 may directly contact the lead frames 111 and 112 to be connected thereto, rather than by the conductive wire W.

The body portion 120 may be disposed on the substrate 101 and the lead frames 111 and 112, and may form a cavity receiving the light emitting element 130 therein. The body portion 120 may have a cup shape so as to improve the reflective efficiency of light, but is not limited thereto. According to an example embodiment, the body portion 120 may also be integrated with the substrate 101 to provide a package body.

The light emitting element 130 may be disposed on the surface 101, and may be an electroluminescent element emitting light when an electrical signal is applied thereto. The light emitting element 130 may emit blue light. For example, the light emitting element 130 may be a semiconductor light emitting element including a semiconductor layer grown epitaxially. In addition, the light emitting element 130 may be a nanoscale light emitting element including a plurality of nanoscale light emitting structures.

The wavelength conversion unit 150 may be disposed in the cavity formed by the body portion 120, and may include an encapsulation layer 152, a fluoride phosphor 154 dispersed in the encapsulation layer 152, and a green phosphor 156. The fluoride phosphor 154 may be the fluoride phosphor according to an example embodiment of the present disclosure described above. The wavelength conversion unit 150 may emit visible light that is excited by excitation light emitted by the light emitting element 130 so as to have a converted wavelength. For example, the fluoride phosphor 154 and the green phosphor 156 may be excited by blue light emitted by the light emitting element 130 to respectively emit red light and green light. The encapsulation layer 152 may be formed from a light transmitting resin, and for example, may include epoxy, silicon, modified silicon, a urethane resin, an oxetane resin, acryl, polycarbonate, polyimide, or a combination thereof.

In an example embodiment, since the fluoride phosphor 154 is coated with an ionic liquid, relatively high moisture resistance may be exhibited. Thus, device reliability may be ensured even when a member for protecting the wavelength conversion unit, such as a separate cover glass, is not present, thereby providing a simplified process for producing the device.

Figure 13:
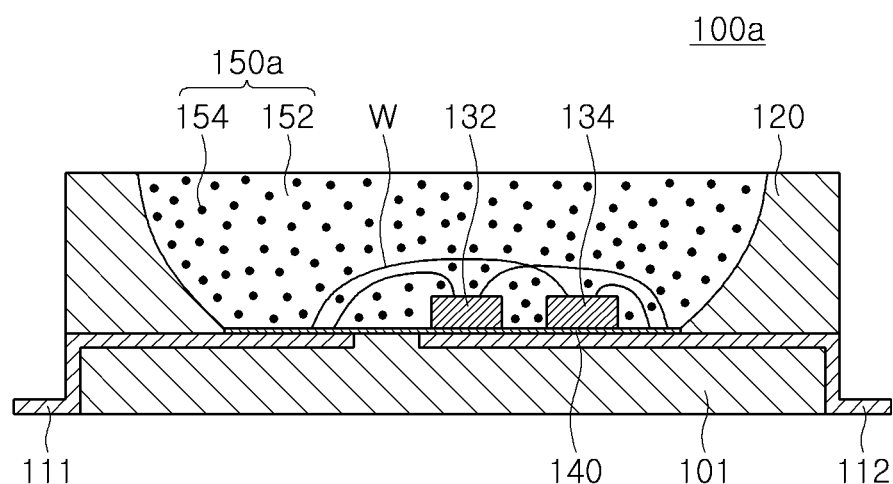
FIG. 13 is a schematic cross-sectional view of a light emitting device according to an example embodiment.

FIG. 13 is a schematic cross-sectional view of a light emitting device according to another example embodiment.

With reference to FIG. 13, a light emitting device 100a may include a substrate 101, first and second light emitting elements 132 and 134 disposed on the substrate 101, a protective layer 140, and a wavelength conversion unit 150a. In addition, the light emitting device 100a may include a pair of lead frames 111 and 112 electrically connected to the first and second light emitting elements 132 and 134, a body portion 120 having a cup shape, and a conductive wire W connecting the first and second light emitting elements 132 and 134 to each other and the lead frames 111 and 112.

In the light emitting device 100a according to this example embodiment, two light emitting elements, for example, the first and second light emitting elements 132 and 134, may be mounted on the substrate 101 in a manner different from the example embodiment of FIG. 12. The first and second light emitting elements 132 and 134 may emit light having different wavelengths. For example, the first light emitting element 132 may emit green light, and the second light emitting element 134 may emit blue light. Thus, the wavelength conversion unit 150a may only include an encapsulation layer 152 and a fluoride phosphor 154 according to an example embodiment discussed above.

The protective layer 140 may be disposed on at least one surface of the wavelength conversion unit 150a. In this example embodiment, although the protective layer 140 is disposed on a lower surface of the wavelength conversion unit 150a, for example, between the wavelength conversion unit 150a and the substrate 101, the disposition of the protective layer 140 may be variously changed thereby achieving different embodiments. For example, the protective layer 140 may be disposed on both an upper surface and a lower surface of the wavelength conversion unit 150a, or may be disposed so as to encompass the entirety of the wavelength conversion unit 150a.

The protective unit 140 may protect the fluoride phosphor 154 from an external environment, for example, moisture, and may ensure reliability of the light emitting device 100a. Therefore, the protective layer 140 may be formed from a moisture resistive material capable of preventing permeation of moisture. The thickness of the protective layer 140 is not limited to any thickness inferred by FIG. 13. In the light emitting device 100a according to this example embodiment, the fluoride phosphor 154 may be coated with an ionic liquid, thereby improving its resistance to moisture. In addition, the protective layer 140 may also be used, and thus the reliability of the light emitting device may be increased even further. However, protective layer 140 may be omitted according to an example embodiment, as protective layer 140 is an optional component.

The protective layer 140 may be formed from a resin material such as epoxy, silicon, modified silicon, a urethane resin, an oxetane resin, an acrylate resin, polycarbonate, polyimide, and the like. In this case, the reflectivity of the protective layer 140 may be different from that of the encapsulation layer 152, thereby improving light extraction efficiency. Alternatively, the protective layer 140 may be a coating layer formed from a fluoride- or silica-based coating agent.

Figure 14:
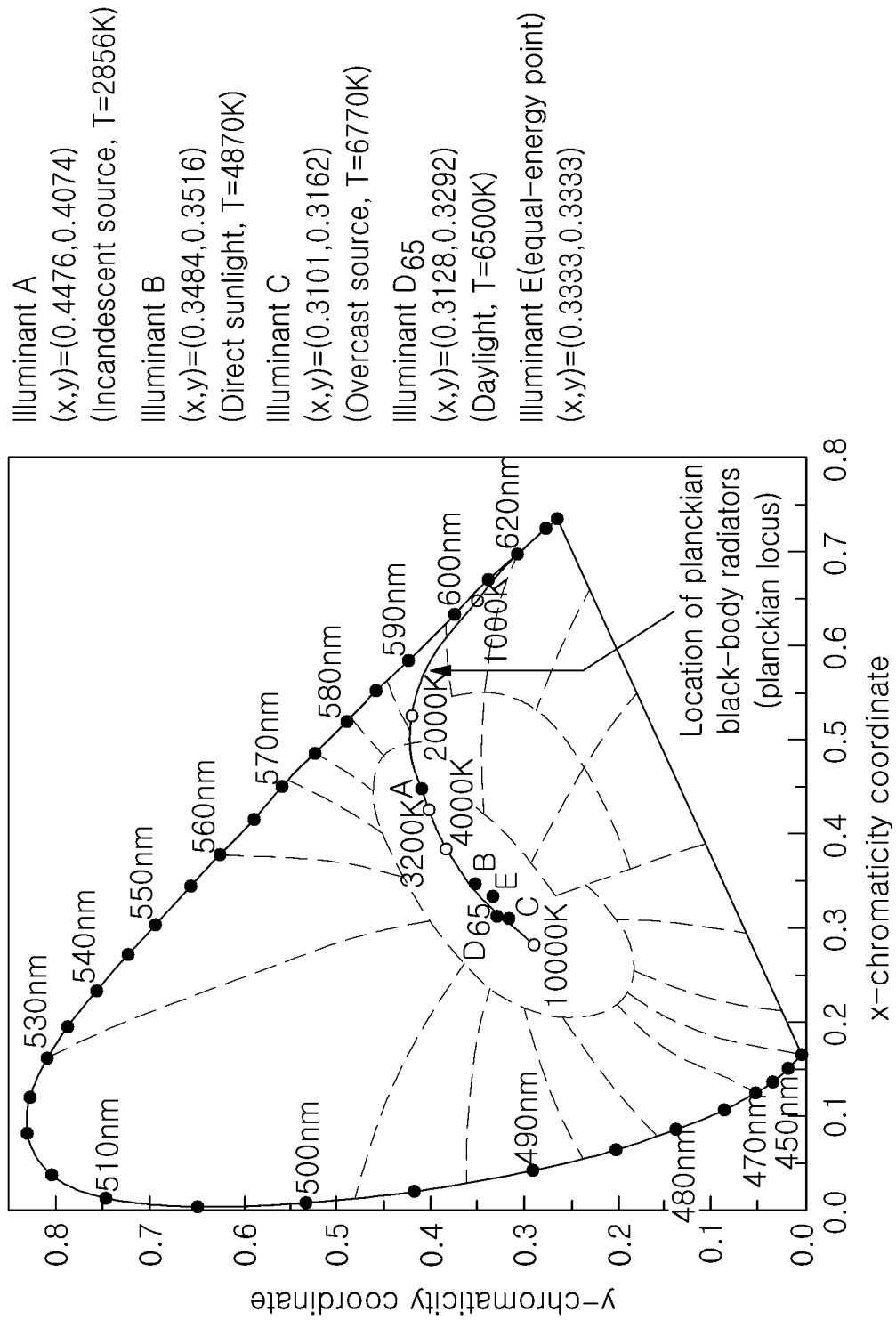
FIG. 14 is a CIE color space chromaticity diagram illustrating a wavelength conversion material employable in a light emitting device according to an example embodiment.

FIG. 14 is a CIE color space chromaticity diagram illustrating a wavelength conversion material employable in a light emitting device according to an example embodiment.

When the light emitting element 130 or 134 of FIGS. 12 and 13 emits blue light, the light emitting device 100 or 100a including at least one of yellow, green, and red phosphors may emit white light having various color temperatures that may be adjusted by the phosphor mixing ratio. For example, the color temperature and color rendering index (CRI) of the white light may be controlled by additionally combining a green and/or a red phosphor with a yellow phosphor.

The white light formed by a combination of yellow, green, and red phosphors and a blue light emitting device and/or through a combination of a blue light emitting device and green and red light emitting devices may have two or more peak wavelengths. Additionally, coordinates (x, y) of a CIE 1931 chromaticity coordinates system may be located on line segments (0.4476, 0.4074), (0.3484, 0.3516), (0.3101, 0.3162), (0.3128, 0.3292), and (0.3333, 0.3333) connected to one another as illustrated in FIG. 14. Alternatively, the coordinates (x, y) may be located in a region surrounded by the line segments and blackbody radiation spectrum. The color temperature of the white light may be within the range of from 1500 K to 20000 K.

In FIG. 14, the white light in the vicinity of point E (0.3333, 0.3333) disposed below the blackbody radiation spectrum may be in a state in which a level of yellow light is relatively low, and may be used as a lighting light source in a region exhibiting brighter or fresher feeling to the naked eye. Therefore, lighting products using white light in the vicinity of point E (0.3333, 0.3333) disposed below the blackbody radiation spectrum may be highly effective as lighting devices for retail spaces in which consumer goods are offered for sale.

As a phosphor used for the light emitting device described above, a phosphor as described below may be used. In the case of a red phosphor, a fluoride phosphor according to exemplary embodiments of the present disclosure may be used. For example, the fluoride phosphor 154 may include a fluoride phosphor represented by the formula $A_3MF_7:Mn^{4+}$, and for example, may be $K_3SiF_7:Mn^{4+}$, $K_3TiF_7:Mn^{4+}$, $K_3ZrF_7:Mn^{4+}$, $K_3SnF_7:Mn^{4+}$, $Na_3TiF_7:Mn^{4+}$, $Na_3ZrF_7:Mn^{4+}$, $(Rb, K)_3SiF_7:Mn^{4+}$, and $(Cs, K)_3SiF_7:Mn^{4+}$. The wavelength conversion unit 150 or 150a may further include other phosphors illustrated below by way of example.

Figure 15:
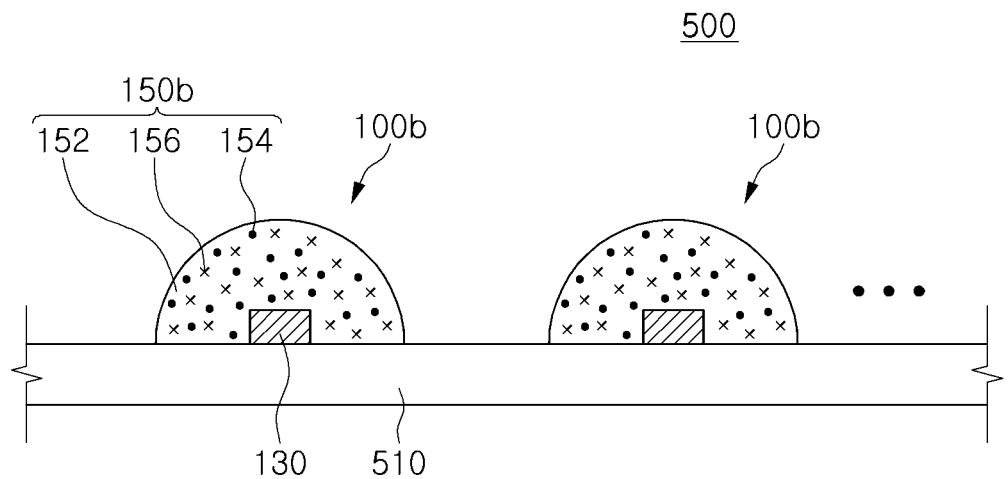
FIG. 15 is a schematic cross-sectional view of a white light source module according to an example embodiment.

Oxides: yellow and green $Y_3Al_5O_{12}:Ce$, $Tb_3Al_5O_{12}:Ce$, $Lu_3Al_5O_{12}:Ce$ Silicates: yellow and green $(Ba,Sr)_2SiO_4:Eu$, yellow and orange $(Ba,Sr)_3SiO_5:Ce$ Nitrides: green $\beta$-SiAlON:Eu, yellow $La_3Si_6N_{11}:Ce$, orange $\alpha$-SiAlON:Eu Light Source Module, Backlight Unit, Display Apparatus, and Lighting Device Including Fluoride Phosphor FIG. 15 is a schematic cross-sectional view of a white light source module according to an example embodiment.

With reference to FIG. 15, a light source module 500 for a liquid crystal display (LCD) backlight may include a circuit board 510, and a plurality of white light emitting devices 100b mounted on the circuit board 510. A conductive pattern connected to the white light emitting devices 100b may be formed on the circuit board 510.

Different from the light emitting device described with reference to FIG. 12, respective white light emitting devices 100b may have a structure in which a light emitting element 130 emitting blue light is directly mounted on the circuit board 510 in a chip on board (COB) scheme. The respective white light emitting devices 100b may not have a separate reflective wall, and the wavelength conversion unit 150b may have a semispherical shape having a lens function so as to exhibit a wide-beam angle. The wide-beam angle may contribute to a reduction in the thickness or a width of an LCD display.

Figure 16:
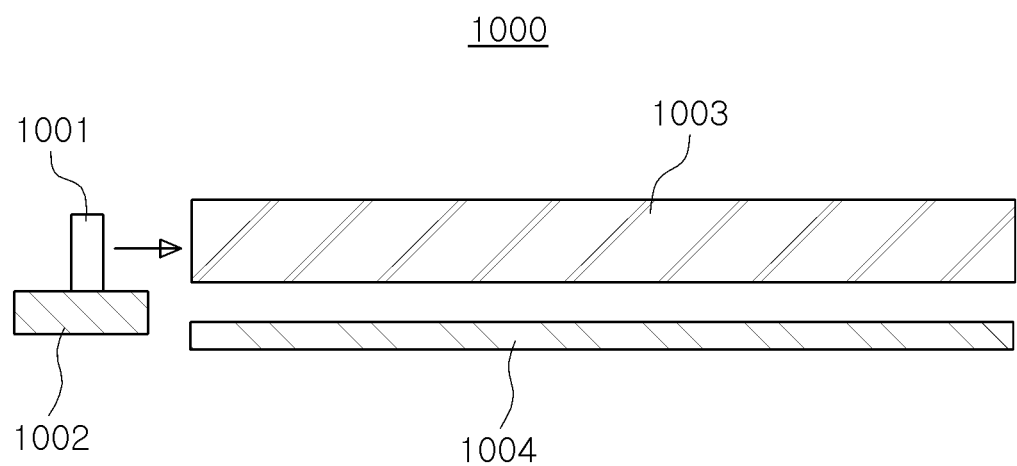
FIG. 16 is a schematic cross-sectional view of a backlight unit according to an example embodiment.

FIG. 16 is a schematic cross-sectional view of a backlight unit according to an example embodiment.

With reference to FIG. 16, in backlight unit 1000, a light source 1001 mounted on a substrate 1002 emits light in a lateral direction so that the emitted light may be incident onto a light guide panel 1003 to be converted into a form of surface light source. Light passing through the light guide panel 1003 may be discharged in an upward direction, and a reflective layer 1004 may be disposed below the light guide panel 1203 to improve light extraction efficiency.

Figure 17:
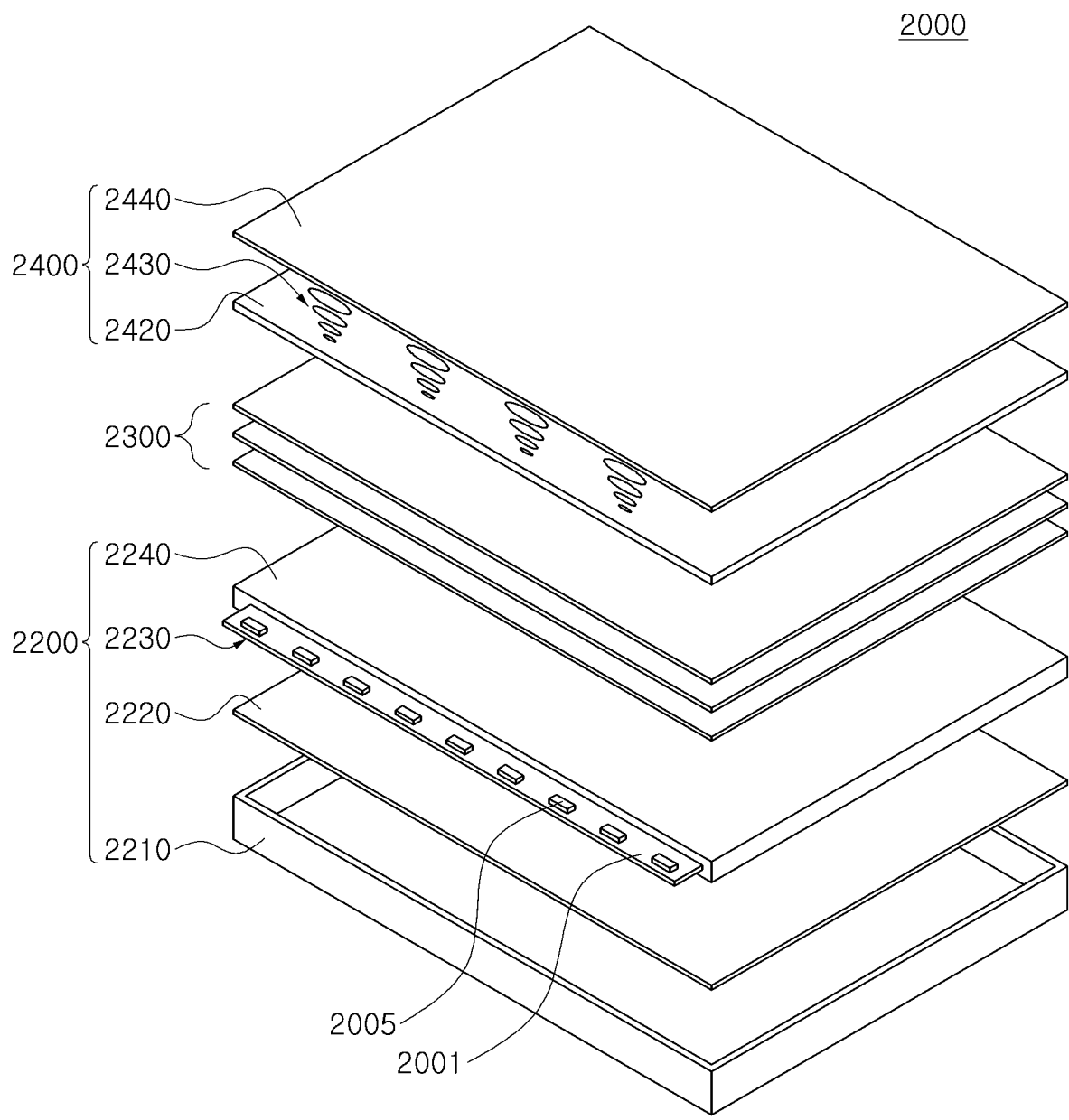
FIG. 17 is a schematic exploded perspective view of a display apparatus according to an example embodiment.

FIG. 17 is a schematic exploded perspective view of a display apparatus according to an example embodiment.

With respect to FIG. 17, a display apparatus 2000 may include a backlight unit 2200, an optical sheet 2300, and an image display panel 2400, such as a liquid crystal panel.

The backlight unit 2200 may include a bottom case 2210, a reflective plate 2220, a light guide panel 2240, and a light source module 2230 provided on at least one side of the light guide panel 2240. The light source module 2230 may include a printed circuit board 2001 and light emitting devices 2005. The light emitting device 2005 may include one of the light emitting devices 100 and 100*a* of FIGS. 12 and 13. In detail, the light emitting device 2005 may be a side view-type light emitting device with a side surface mounted to be adjacent to a light emission surface.

The optical sheets 2300 may be disposed between the light guide panel 2240 and the image display panel 2400, and may include several types of sheets, such as a diffusion sheet, a prism sheet, or a protective sheet.

The image display panel 2400 may display an image using light emitted through the optical sheets 2300. The image display panel 2400 may include an array substrate 2420, a liquid crystal layer 2430, and a color filter substrate 2440. The array substrate 2420 may include pixel electrodes disposed in a matrix form, thin film transistors applying a driving voltage to the pixel electrodes, and signal lines allowing for operation of the thin film transistors. The color filter substrate 2440 may include a transparent substrate, a color filter, and a common electrode. The color filter may include filters allowing a specific wavelength of light to pass through from among the wavelengths in the white light emitted by the backlight unit 2200. The liquid crystal layer 2430 may be re-arranged by an electric field formed between the pixel electrodes and a common electrode so as to adjust the light transmitting rate. Light may then pass through the color filter of the color filter substrate 2440, thereby displaying an image. The image display panel 2400 may further include a driving circuit unit processing an image signal, and the like.

In terms of the display device 2000 according to this example embodiment, when a light emitting device 2005 that emits blue, green, and red light having a relatively narrow full width at half maximum is used, emitted light passes through the color filter substrate 2440, and may provide for blue, green, and red colors having relatively high color purity.

Figure 18:
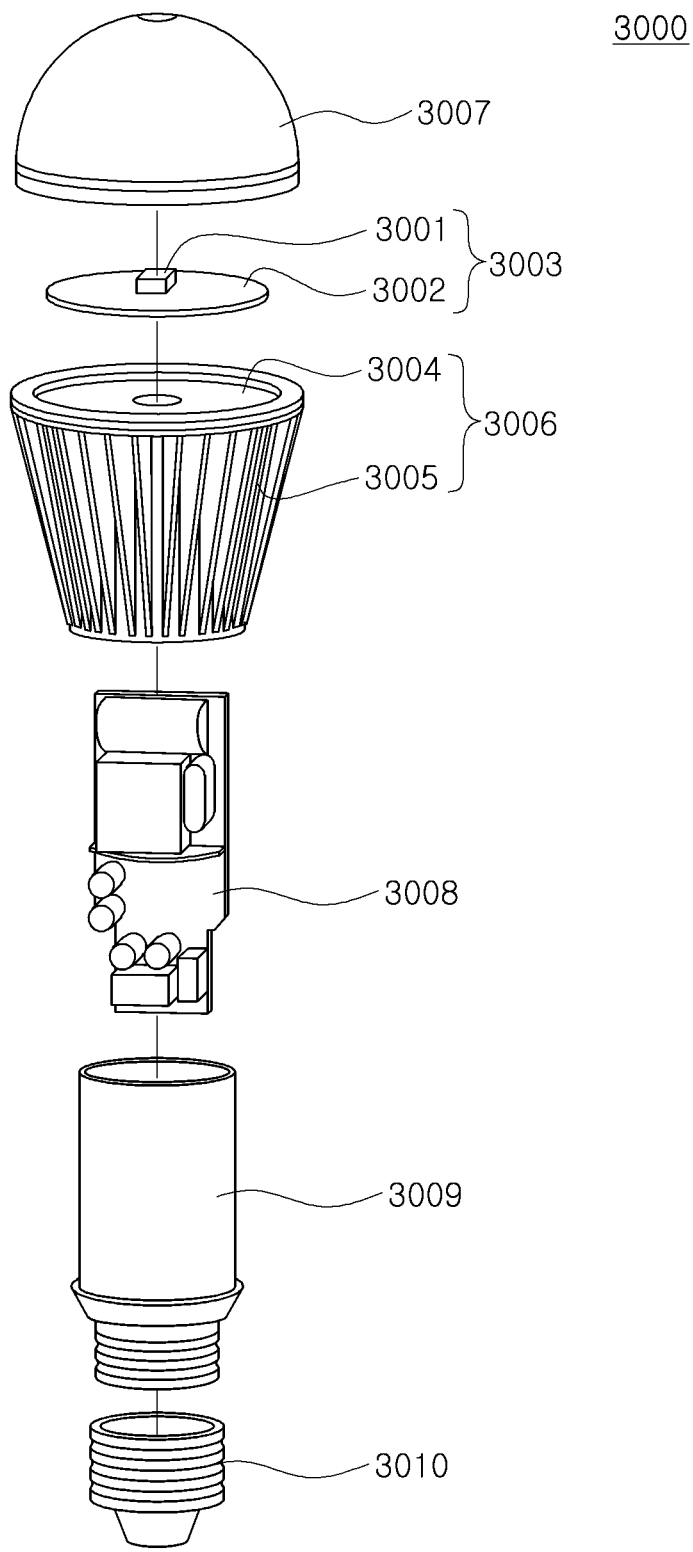
FIG. 18 is a schematic exploded perspective view of a lighting device according to an example embodiment.

FIG. 18 is a schematic exploded perspective view of a lighting device according to an example embodiment.

With reference to FIG. 18, a lighting device 3000 is illustrated as a bulb type lamp by way of example, and may include a light source module 3003, a driving unit 3008, and an external connection unit 3010. The lighting device 3000 may further include an external structure such as an external housing 3006, an internal housing 3009, and a cover unit 3007. The light source module 3003 may include a semiconductor light emitting element 3001 having a structure the same as or similar to the light emitting device 100 or 100*a* of FIGS. 12 and 13, and a circuit board 3002 having the semiconductor light emitting device 3001 mounted thereon. Although this example embodiment illustrates a case in which a single semiconductor light emitting element 3001 is mounted on the circuit board 3002, a plurality of semiconductor light emitting elements 3001 may be mounted thereon. In addition, the semiconductor light emitting element 3001 may be first manufactured in a package form, and may be mounted in a manner other than being directly mounted on the circuit board 3002.

The external housing 3006 may serve as a heat emission portion, and may include a heat emission plate 3004 directly contacting the light source module 3003 so as to improve the heat radiant effect and heat radiating fins 3005 surrounding a side surface of the lighting device 3000. The cover unit 3007 may be mounted on the light source module 3003 and may have a convex lens shape. The driving unit 3008 may be mounted in the internal housing 3009 so as to be connected to the external connection unit 3010, which may have a screw base structure configured to receive power from an external power supply unit. In addition, the driving unit 3008 may serve to convert power into a current source appropriate for driving the light source 3001 of the light source module 3003 and provide the converted current. For example, the driving unit 3008 may be configured so as to include an alternating current-direct current (AC-DC) converter, a rectifying circuit component, or the like.

Furthermore, the lighting device 3000 may further include a communications module, which is not illustrated in the FIG. 18.

Figure 19:
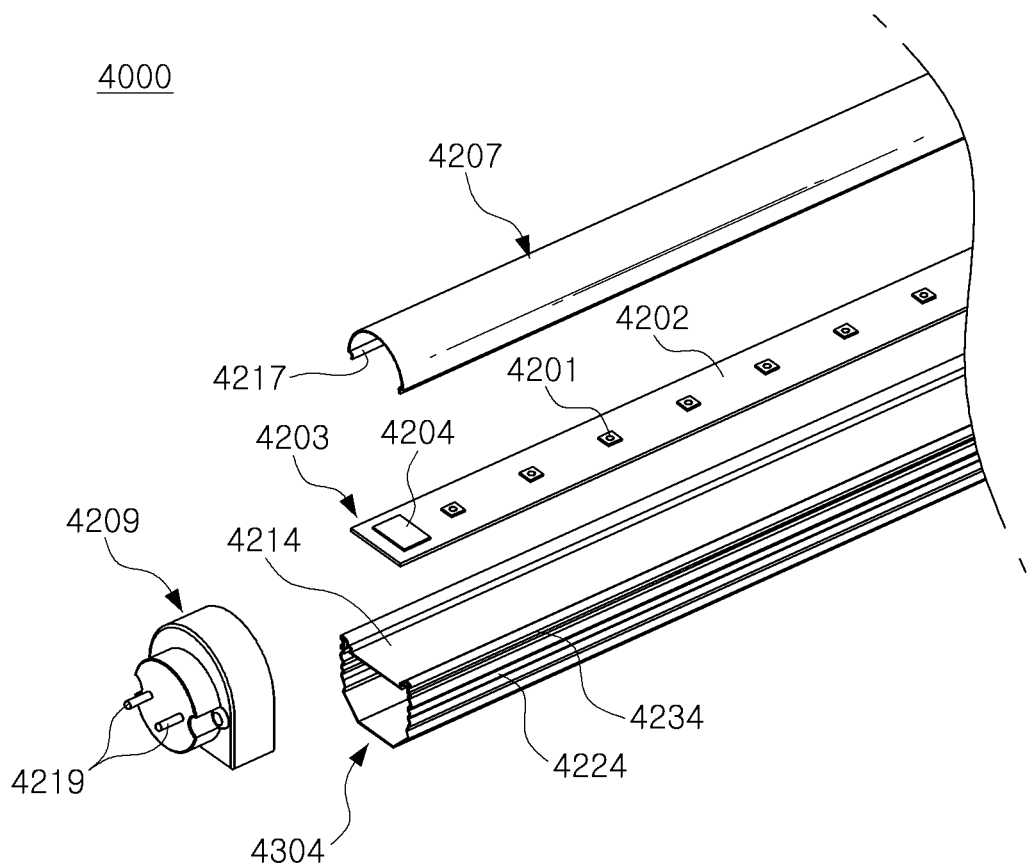
FIG. 19 is a schematic exploded perspective view of a lighting device according to an example embodiment.

FIG. 19 is a schematic exploded perspective view of a lighting device according to an example embodiment.

With reference to FIG. 19, a lighting device 4000 may include a light source module 4203, a body portion 4304, and a driving unit 4209, and may further include a cover unit 4207 covering the light source module 4203. The lighting device 4000 may be a bar-type lamp, and may have a shape similar to a fluorescent lamp. In addition, the lighting device 4000 may emit light having light characteristics similar to that of a fluorescent lamp, but is not limited thereto.

The light source module 4203 may include a mounting substrate 4202 and a plurality of light emitting elements 4201 and controller 4204 mounted on the mounting substrate 4202. Controller 4204 may store driving information for the light source 4201. The plurality of light emitting elements 4201 may have a structure the same as or similar to that of the light emitting device 100 or 100*a* of FIGS. 12 and 13. Alternatively, the light source module 4203 may employ the light source module 500 for the LCD backlight of FIG. 15.

The light emitting element 4201 may be bonded to the mounting substrate 4202 by an adhesive member, and the adhesive member may have a scattering pattern.

The body portion 4304 may be provided with the light source module 4203 mounted thereon and fixed to one surface thereof. The body portion 4304 may serve as a support structure, and may include a heat sink. The body portion 4304 may be formed from a material having excellent heat conductivity capable of externally emitting heat generated from the light source module 4203, and may be for example, formed from a metal, although the material is not limited thereto. The body portion 4304 may have a lengthwise long rod shape corresponding to the shape of the mounting substrate 4202 of the light source module 4203. One surface of the body portion 4304 on which the light source module 4203 is mounted may include a recess portion 4214 in which the light source module 4203 may be received. At least one external surface of the body portion 4304 may be provided with a plurality of heat radiating fins 4224 protruding therefrom for heat radiation. A stop groove 4234 may be formed on an external surface of the body portion 4304 extending in a lengthwise direction of the body portion 4304 on two sides of the recess portion 4214. The stop groove 4234 may be coupled to the cover unit 4207. At least one end of the body portion 4304 in a lengthwise direction thereof may be open. Thus, the body portion 4304 may have a pipe shaped structure in which one end is open.

The driving unit 4209 may be provided at the open end portion of the body portion 4304 so as to supply driving power to the light source module 4203. The driving unit 4209 may include electrode pins 4219 protruding externally.

The cover unit 4207 may be coupled to the body portion 4304 so as to cover the light source module 4203. The cover unit 4207 may be formed from a material through which light may be transmitted. The cover unit 4207 may have a curved, semicircular surface so that light may be uniformly and externally irradiated. A protrusion 4217 may be formed on a lower surface of the cover unit 4207 coupled to the body portion 4304, so as to be engaged with the stop groove 4234 of the body portion 4304 in a lengthwise direction of the cover unit 4207.

This example embodiment illustrates a case in which the cover unit 4207 has a semicircular structure. However, the shape of the cover unit 4207 is not limited thereto, and may be variously changed depending on the desired illumination design in connection with the irradiation of light. For example, the cover unit 4207 may have a flat quadrangular shape or a polygonal structure.

As set forth above, with reference to example embodiments, a fluoride phosphor having improved luminance and reliability is provided by manufacturing the fluoride phosphor at an optimized firing temperature using a sintering aid. Accordingly, a light emitting device may be provided. Also as disclosed above, and a method of manufacturing the fluoride phosphor is provided.

While example embodiments have been shown and described above, it will be apparent to those skilled in the art that modifications and variations may be made without departing from the scope of the present disclosure.

What is claimed is:

1. A method of manufacturing a fluoride phosphor represented by a chemical formula $A_3MF_7:Mn^{4-}$, the method comprising:
forming a first mixture by mixing a first raw material containing $A_2MF_6$ and a second raw material containing AF or $AHF_2$;
forming a second mixture by mixing the first mixture and a sintering aid; and
firing the second mixture,
wherein in the chemical formula, A is selected from the group consisting of lithium (Li), sodium (Na), potassium (K), rubidium (Rb), cesium (Cs) and mixtures thereof, and M is selected from the group consisting of silicon (Si), titanium (Ti), zirconium (Zr), hafnium (Hf), germanium (Ge), tin (Sn) and mixtures thereof; and
the sintering aid comprises at least one of $NH_4F$, $NH_4HF_2$, $F_2$, and $XeF_2$.

2. The method of claim 1, wherein the sintering aid further comprises $KHF_2$.

3. The method of claim 1, wherein the sintering aid is added to the first mixture in an amount of more than 5 wt %.

4. The method of claim 1, wherein the firing is performed at a temperature higher than 250° C. and lower than 400° C.

5. The method of claim 1, wherein the firing is performed in an atmosphere of argon (Ar), nitrogen ($N_2$), fluorine ($F_2$), nitrogen/fluorine ($N_2/F_2$) or nitrogen/hydrogen ($N_2/H_2$).

6. The method of claim 1, wherein the firing is performed for 4 to 8 hours.

7. The method of claim 1, wherein the first and second raw materials are mixed in powder form.

8. The method of claim 1, wherein the first and second raw materials are mixed in a molar ratio of from 1:0.8 to 1:1.5.

9. The method of claim 1, wherein the first raw material is a $Mn^{n+}$ doped $A_2MF_6$ phosphor, and the second raw material is AF.

10. The method of claim 9, wherein the first raw material is a Me doped $K_2SiF_6$ phosphor, and the second raw material is at least one of KF, RbF, and CsF.

11. The method of claim 1, wherein the first raw material is a mixture of $A_2MF_6$ and $A_2MnF_6$, and the second raw material is AF.

12. The method of claim 11, wherein the first raw material is a mixture of $K_2SiF_6$ and $K_2MnF_6$, and the second raw material is KF.

13. The method of claim 1, further comprising coating a phosphor particle produced by the firing with an ionic liquid.

14. The method of claim 13, wherein the ionic liquid comprises 1-methyl-1-propylpyrrolidinium Bis (trifluoromethanesulfonyl) imide.

15. A method of manufacturing a fluoride phosphor represented by a chemical formula $A_3MF_7:Mn^{4-}$, the method comprising:
forming a first mixture by mixing a first raw material containing $A_2MF_6$ and a second raw material containing AF or $AHF_2$;
forming a second mixture by mixing the first mixture and a sintering aid;
manufacturing a phosphor particle by firing the second mixture; and
coating the phosphor particle with an ionic liquid,
wherein in the chemical formula, A is selected from the group consisting of lithium (Li), sodium (Na), potassium (K), rubidium (Rb), cesium (Cs), and mixtures thereof, and M is selected from the group consisting of silicon (Si), titanium (Ti), zirconium (Zr), hafnium (Hf), germanium (Ge), tin (Sn), and mixtures thereof; and
the sintering aid comprises at least one of $NH_4F$, $NH_4HF_2$, $F_2$, and $XeF_2$.

16. The method of claim 1, wherein the sintering aid is added to the first mixture in an amount of 5 wt % to 15 wt %.

17. The method of claim 15, wherein the fluoride phosphor is formed by a solid state reaction.

18. The method of claim 1, wherein the sintering aid comprises $NH_4F$.

19. The method of claim 15, wherein the sintering aid comprises $NH_4F$.

* * * * *